United States Patent

[11] 3,615,951

[72] Inventors Jack R. Franco
Poughkeepsie;
Paul A. Totta, Poughkeepsie; James F. White, Wappingers Falls, all of N.Y.
[21] Appl. No. 835,009
[22] Filed June 20, 1969
[45] Patented Oct. 26, 1971
[73] Assignee International Business Machines Corporation
Armonk, N.Y.

[54] METHOD FOR ETCHING COPPER
13 Claims, 2 Drawing Figs.

[52] U.S. Cl. .......... 156/3, 156/4, 156/8, 156/18
[51] Int. Cl. .......... H05k 3/06, C23f 1/02
[50] Field of Search .......... 156/3, 4, 24, 17, 7, 8, 18

[56] References Cited

UNITED STATES PATENTS 2,997,521 8/1961 Dahlgren .......... 178/68.5

OTHER REFERENCES

IBM Technical Disclosure Bulletin Etching Process Franco et al., Vol. 11 No. 2, July 1968. p. 103. Copy in 156–3

*Primary Examiner*—Jacob H. Steinberg
*Attorneys*—Hanifin & Jancin and Wolmar J. Stoffel

ABSTRACT: A method for subtractive etching copper adapted to form very fine line patterns. In the method a mask is deposited on the copper surface, the copper surface exposed to an environment containing an oxidizing agent which causes the formation of an adherent self thickness limiting coating of a copper compound on the exposed surface, the resultant adherent coating removed in a second environment, and the steps of forming the coating and removing repeated until the desired amount of copper has been removed.

INVENTOR
JACK R. FRANCO
PAUL A. TOTTA
JAMES F. WHITE

BY Wolmar J. Stoffel
ATTORNEY

METHOD FOR ETCHING COPPER

BACKGROUND OF THE INVENTION

1. Field of the Invention

The invention relates to selectively etching copper, usually coatings, and more particularly to the production of very fine line patterns in copper films on semiconductor devices and the like.

2. Description of the Prior Art

The technique and subtractive etching is well known and has been used extensively in the fabrication of printed circuit boards and the like. The technique used for etching these patterns usually involves the formation of a photoresist image on copper layer followed by spray etching with ferric chloride plus packing additives. The ferric chloride directly attacks and removes unwanted copper while the packing additives build up along the edge of the pattern and prevent excessive undercut of the photoresist image. Typically the finest lines etched by this technique are one mil in width and one mil in spacing.

The development of integrated semiconductor devices has led to the design and fabrication of subminiature circuits printed directly on the surface of the device. This development has greatly increased the speed and reliability of semiconductor devices. To achieve even greater circuit density through microminiaturization, it is often desirable to have more than one printed wiring plane since a single level metallurgy pattern does not allow sufficient freedom and space in designing the interconnecting wiring for the more compact arrangement of circuit components on solid state functional circuits. With the emphasis on greater speeds, that is shorter response times, particularly in the fabrication of devices utilized for computer circuits, the devices have become increasingly smaller. Increased miniaturization of the devices and the packing together of the individual components reduces the capacitive effects of the components themselves. The wiring provides a shorter path for the electricity through the various circuits thus lowering electrical delay. This results in significantly improved performance.

The use of copper on semiconductor devices is desirable because of its relatively high conductivity. However, since it is known that copper poisons the semiconductor per se a suitable barrier must be used between the metallurgy and the semiconductor material when copper is used in the first level of the metallurgy. However, this requirement is ordinarily not required in metallurgy levels above the first level. With the utilization of advanced microminiaturized techniques the etching of fine line patterns in copper films on semiconductor devices requires an order of magnitude improvement in minimum line width and spacing. Present needs and goals call for 0.3 mil lines with 0.1 mil spacings, and with either smaller lines and spacings being considered. The conventional techniques for etching copper circuit boards with spray ferric chloride etc. have been found totally ineffective to meet the aforementioned requirements since such techniques result in significant undercutting of the pattern and complete obliteration of very fine interconnection lines.

Sputter etching techniques have been proposed and used to form ultrafine patterns in copper and other metallic films. However, such sputter techniques have encountered problems such as contamination of the device by the inherent resputtering of the copper removed previously and deposited on the walls of the chamber. The thickness of the film which can be removed is limited since masks break down over sputtering times. Further, the rate of removal is slow, and the operation relatively expensive.

SUMMARY OF THE INVENTION

An object of this invention is to provide a method for forming very fine line patterns in copper films.

Yet another object of the invention is to provide a controllable subtractive etching method for copper wherein the undercutting of the copper beneath the masking pattern is minimized.

These and other objects of the invention are achieved in the method of subtractive etching of copper of the invention by forming a masking layer over the surface of the copper to be etched, exposing the unmasked areas to a first environment which includes an oxidizing agent, causing the oxidizing agent in the environment to react with the exposed copper to result in the formation of an adherent self limiting thickness coating of a copper compound on the exposed surface, exposing the resultant adherent coating to a second environment which removes the adherent coating but does not significantly affect the resultant newly exposed copper surface, and alternately exposing the exposed copper to the first environment to form an adherent coating and subsequently to the second environment which removes the resultant coating until the desired amount of copper has been removed.

BRIEF DESCRIPTION OF THE DRAWINGS

The nature, principal, and details of the invention, as well as other objects and advantages thereof, will be best understood by reference to the following description, taken in conjunction with the accompanying drawings in which like parts are designated by like referenced characters in which.

DESCRIPTION OF PREFERRED EMBODIMENTS

The following method is particularly adapted to produce very fine copper lines by subtractive etching of a Cu layer supported on a substrate, typically a semiconductor substrate. The method is particularly useful in etching metallurgy patterns on microminiaturized semiconductor devices but could find other applications as well, as for example in the production of masks.

Figure 2:
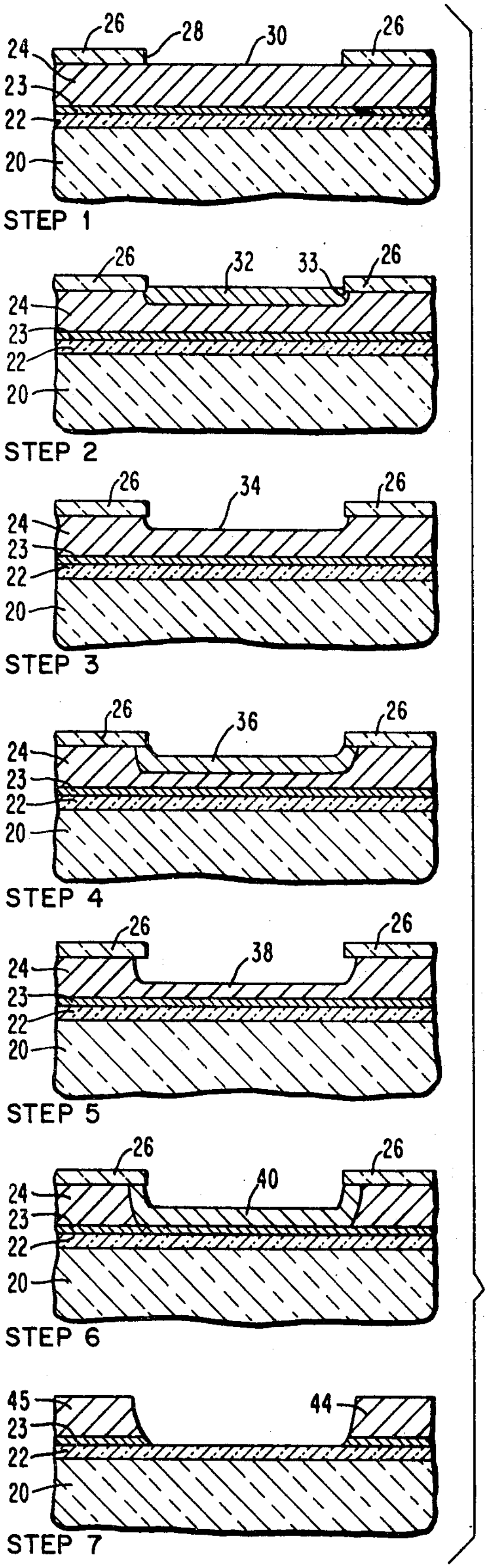
FIG. 2 is a series of cross-sectional views illustrating the method applied to etching a copper layer.

Referring now to the drawings there is shown in Step 1 of FIG. 2 a semiconductor substrate 20 with a passivating silicon dioxide layer 22, a layer 23 of chromium, and an overlying adherent layer of copper 24 to be subtractively etched by the method of the invention. Copper layer 24 can be deposited by any suitable method as for example evaporation, electroless plating, sputter deposition, etc. The layer 24 can be any suitable thickness. However, in modern device metallurgy it would be desirable that the thickness be on the order of 10,000 A.

A suitable mask 26 is deposited on layer 24 and shaped to the desired pattern. Typically mask 26 is a photoresist such as polyvinylalcohol, KPR (Kodak Photo Resist), or KMER (Kodak Metal Etch Resist). Such photoresist masks are well-known in the art and their techniques for applying and exposing widely utilized. Briefly, the photoresist coating is applied to the substrate to a thickness of several thousand angstroms to several microns and then dried to a hardened state. The dried resist layer is then exposed through a stencil or mask to a strong source of monochromatic light. The photoresist is then developed by dipping the photosensitized specimen in a suitable developer and rinsing which removes the desired portions indicated as an opening 28. Alternately, the mask can be of a suitable metal such as chromium, titanium, molybdenum, tantalum, or tungsten. Typically such masks would be deposited over the top of layer 24, and subsequently etched with a suitable etchant through a photoresist which had been exposed and developed. Metal masks are particularly useful when the environment used subsequently is too harsh for the conventional photoresist. In the flow chart shown in FIG. 1 forming the mask is indicated by block 10. The unmasked surface 30 of layer 24 is then exposed to an environment which includes an oxidizing agent. The oxidizing agent reacts with the exposed copper and causes the formation of an adherent coating 32 of a copper compound on the unmasked surface as indicated in Step 2 of FIG. 2 and block 12 of FIG. 1. The layer 32 adheres to the copper layer 24, and after it has built up to a certain thickness inhibits further formation of the layer in the environment. Layer 32 can be of any suitable copper compound preferably copper iodide, copper oxide, or copper sulfide, or mixtures thereof. As indicated in Step 2 there is inevitably a small degree of undercutting 33 of the mask 26. However it is controlled and is relatively uniform along the edges of the mask. The thickness of the resultant coating 32 of the copper compound will depend upon the type of compound and the conditions within the oxidizing environment. Typically, however, approximately 3,000 to 5,000 A. of the exposed copper of layer 24 will be utilized in the formation of layer 32. In general, since the formation of layer 32 is self-limiting the exposure of the wafer in the oxidizing environment is not critical since the reaction will either stop or proceed at a negligible rate after a predetermined thickness has been built up.

Figure 1:
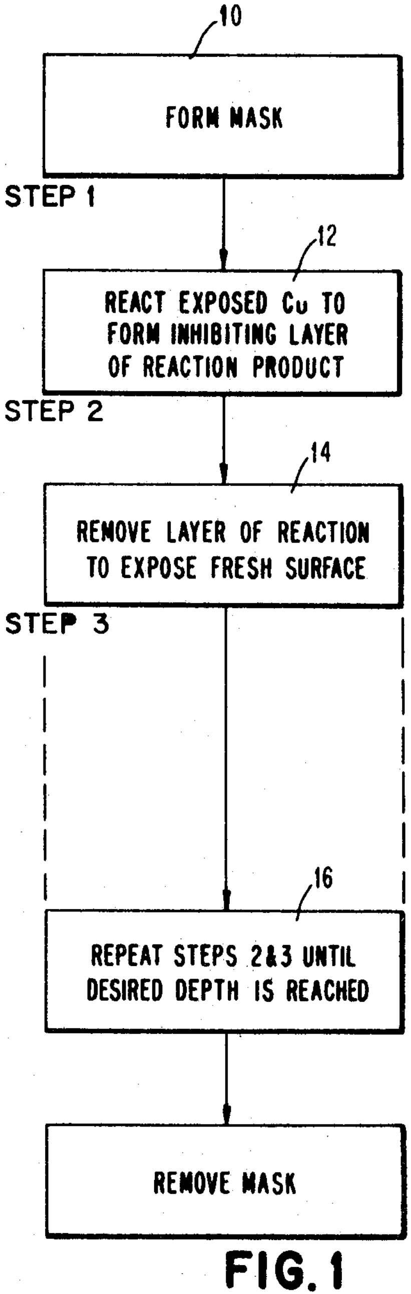
FIG. 1 is a flow chart setting forth the various steps of the method of the invention in logical sequence.

The resultant layer 32 of the copper compound is then removed by exposing it to a second environment which is indicated by block 14, FIG. 1 which results in the structure shown in Step 3 of FIG. 2. Any suitable medium, typically a solution, can be used which will remove the copper compound coating 32. Preferably the medium or solution will not significantly adversely affect the mask 26 or the resultant newly exposed copper surface 34 in layer 24. A selection of the reactant in the second environment to remove the coating 32 will depend on the type of copper compound in the coating. An excellent solution for dissolving copper iodide, copper oxide or copper sulfide is a solution commercially available sold under the trade mark of "Neutroclean 68" by Shiply Co. A copper oxide coating can be removed with dilute sulfuric acid solution, or a 5 to 10 percent ammonium chloride solution. Yet another suitable solution for removing the copper compound is an ammoniacal solution saturated with sodium sulfite. The second coating 36 of a copper compound is then grown by exposing the fresh unmasked copper surface 34 to the oxidizing agent previously described. Coating 36 is then removed by subjecting it to the second environment which includes an agent to dissolve it. This exposes a new fresh copper surface 38 as shown in Step 5. The fresh copper surface is then exposed to the first environmental including an oxidizing agent to result in another layer 40 of a copper compound which is subsequently removed as shown in Step 7 of FIG. 2. The mask 26 is thereafter removed leaving portions 44 and 45 of original layer 24. When the mask is chromium, it can be removed simultaneously with underlying layer 23. Preferably the mask and layer 23 have the same thickness. The alternate oxidation and dissolving of the resultant coating is indicated by block 16 of FIG. 1. Each time the copper surface is oxidized a portion of the layer 24 is removed. The steps of oxidizing and dissolving the resultant coating are continued until the desired amount of copper is removed as indicated in Step 7. As indicated there is a small amount of undercutting of the mask 26 in the etching process of the invention. However the undercutting is uniform and is not dependent on the time that the layer is subjected to the previously mentioned environments. This is in contrast to the etching of copper films by exposure to ferric chloride. In the process known to the prior art the removal of the copper layer by ferric chloride proceeds at a relatively uniform rate all the while it is immersed. Thus, if there is a variation in the copper film there may well be variations in the required time in the etchant bath. In such a bath the film is removed in the sidewise direction at approximately the same rate as the etching proceeds downwardly toward the surface of the supporting substrate. Thus slight overexposure could result in significant undercutting. Thus, the timing of the exposure in the etchant bath is critical and there is very little or no room for error when the size of the stripes become small. In contrast the method of the subject invention is not particularly operator dependent and proceeds at a controllable and predictable rate in which the copper film is gradually "nibbled" off.

The copper compound which forms in the unmasked regions of the copper film can be formed by any suitable method. Copper oxide can be formed by exposure to the halogens particularly, iodine, bromine and chloride which are present in the environment in a suitable oxidation state so that they will oxidize copper. The halogens can be present in a solution or vapor. When utilizing a halogen to form a copper compound the photoresist is typically metal, as for example, chromium, titanium, molybdenum, etc. A copper oxide layer can also be formed by exposure to an environment which includes oxygen. An example of such an environment is air at elevated temperatures, typically 200° C. The environment can alternately be an aqueous solution of hydrogen peroxide, typically a 30 percent solution, more preferably 20 to 30 percent.

Another type of copper compound layer which can be formed to remove the copper from layer 24 is copper sulfide. Copper sulfide can be formed by reacting Cu with hydrogen sulfide, sulfur dioxide either as a liquid or a gas, carbon disulfide, either as a gas or in an aqueous solution, or any other suitable combination thereof.

The following example is presented to illustrate preferred embodiments of the method of the invention and should not be used to unduly restrict same.

EXAMPLE

A layer of silicon dioxide was thermally grown on a silicon wafer, and a film of Cr, approximately 500 A. in thickness, deposited by evaporation technique. A layer of copper having an average thickness of 10,000 A. was deposited over the Cr film by evaporation techniques. A masking photoresist layer of KPR was then deposited over the surface of the copper layer, exposed, and developed. The photoresist layer upon being developed had stripe portions approximately 75,000 A. in width spaced 75,000 A. apart. After vacuum baking the resist mask, the wafer was immersed for 3 seconds in an oxidizing solution of 200 grams KI, 100 grams I, in 400 ml. $H_2O$. Inspection revealed an adherent coating over the unmasked areas. The wafer was then immersed for 1 minute in a commercially available solution known as Shipley Neutroclean 68. It was noted upon removal from the solution that the resultant copper iodide layer was removed exposing a fresh copper surface. The sequence of immersing in the oxidizing solution and the cleaning solution was repeated twice more. The time of exposure to the KI solution was varied intentionally. It was noted that formation of the adherent coating apparently stopped after a given time. The etch had proceeded through the copper film in the unmasked areas after three cycles.

Inspection of the resultant edges indicated that there was a controlled relatively uniform undercutting of the Cu film beneath the mask edges. Each cycle of the oxidation and cleaning steps removed approximately 3,000 A. of the copper film.

While the invention has been particularly shown and described with reference to preferred embodiments thereof, it will be understood by those skilled in the art that various changes in form and detail may be made therein without departing from the spirit and scope of the invention.

We claim:

1. A method for subtractive etching a film of Cu [from] supported on a substrate and capable of forming a fine line pattern comprising, forming an adherent masking layer on the substrate over the surface of the Cu to be etched which covers and protects the areas to be retained and exposes the areas to be removed, exposing the unmasked areas to a first environment which includes an oxidizing agent, causing the oxidizing agent in the environment to react with the exposed Cu to result in the formation of an adherent coating of a Cu compound on the exposed surface which inhibits further formation of the coating in the environment beyond a predetermined thickness, exposing the resultant adherent coating to a second environment of a fluid agent which removes the adherent coating but does not significantly affect the resultant newly exposed Cu surface, continuing to alternately [exposing] expose the Cu on the substrate to the first environment which forms an adherent coating, and subsequently to the second environment which removes the resultant coating until the desired amount of Cu has been removed.

2. The method of claim 1 wherein said first environment includes an oxidizing agent selected from the group consisting of reagents of oxygen, sulfur, iodine, bromine and mixtures thereof in an oxidation state capable of oxidizing Cu.

3. The method of claim 2 wherein the adherent coating of a Cu compound is selected from the group consisting of Cu iodide, Cu oxide, Cu sulfide, and mixtures thereof.

4. The method of claim 1 wherein the adherent coating is Cu oxide.

5. The method of claim 4 wherein said first environment is an aqueous solution including iodide ions.

6. The method of claim 4 wherein the Cu oxide coating is removed with an ammoniacal solution of sodium sulfite.

7. The method of claim 4 wherein said first environment includes oxygen.

8. The method of claim 7 wherein said first environment is air at elevated temperatures on the order of 200° C.

9. The method of claim 8 wherein said masking layer is a layer of metal selected from the group consisting of Cr, Ti, Mo, Ta, W and mixtures thereof.

10. The method of claim 4 wherein said first environment is a solution including bromide ions.

11. The method of claim 4 wherein said first environment includes $H_2O_2$.

12. The method of claim 1 wherein the adherent coating is Cu sulfide.

13. The method of claim 12 wherein said first environment at least includes hydrogen sulfide.

* * * * *